United States Patent
Siew et al.

[11] Patent Number: 6,121,135
[45] Date of Patent: Sep. 19, 2000

[54] MODIFIED BURIED CONTACT PROCESS FOR IC DEVICE FABRICATION

[75] Inventors: Yong Kong Siew, Selangor, Malaysia; Lap Chan, San Francisco, Calif.

[73] Assignee: Chartered Semiconductor Manufacturing Ltd., Singapore, Singapore

[21] Appl. No.: 09/314,591

[22] Filed: May 19, 1999

[51] Int. Cl.[7] .................................................. H01L 21/44
[52] U.S. Cl. ......................... 438/666; 438/665; 438/597; 438/618; 438/620; 438/238; 438/239; 438/381; 438/382
[58] Field of Search ..................................... 438/586, 597, 438/618, 620, 622, 631, 665, 666, 238, 239, 381, 382

[56] References Cited

U.S. PATENT DOCUMENTS

| | | | |
|---|---|---|---|
| 5,340,774 | 8/1994 | Yen | 437/240 |
| 5,550,085 | 8/1996 | Liu | 437/203 |
| 5,652,152 | 7/1997 | Pan et al. | 437/26 |
| 5,716,881 | 2/1998 | Liang et al. | 438/238 |
| 5,721,146 | 2/1998 | Liaw et al. | 437/26 |
| 5,780,331 | 7/1998 | Liaw et al. | 438/238 |
| 5,827,764 | 10/1998 | Liaw et al. | 438/238 |
| 5,972,759 | 10/1999 | Liaw | 438/296 |
| 6,001,674 | 12/1999 | Wu | 438/142 |
| 6,057,198 | 5/2000 | Manning | 438/297 |
| 6,071,798 | 6/2000 | Yaung et al. | 438/526 |

*Primary Examiner*—David Hardy
*Assistant Examiner*—N. Drew Richards
*Attorney, Agent, or Firm*—George O. Saile; Rosemary L. S. Pike

[57] ABSTRACT

A new method of forming a butted contact and a buried contact having low contact resistance in the fabrication of integrated circuits is described. A first layer of polysilicon is deposited over a gate silicon oxide layer over the surface of a semiconductor substrate. The first polysilicon and gate oxide layers are etched away to provide an opening to the substrate. A second polysilicon layer is deposited over the first polysilicon layer and the substrate within the opening and doped whereby the buried contact junction is formed in the substrate underlying the doped second polysilicon layer. The second polysilicon layer is planarized. The first and second polysilicon layers are etched away to provide an opening overlying a portion of the buried contact junction wherein a trench is etched into the substrate where the substrate is not covered by the gate oxide layer. An oxide layer is deposited over the second polysilicon layer and within the trench. The oxide layer is etched away wherein the trench and a portion of the second polysilicon layer overlying the buried contact junction and adjacent to the trench are exposed and whereby the oxide is removed from the trench. A third polysilicon layer is deposited over the oxide layer and the second polysilicon and the trench exposed within the opening. The third polysilicon layer is patterned to form a butted contact with the second polysilicon layer exposed within the opening.

21 Claims, 7 Drawing Sheets

MODIFIED BURIED CONTACT PROCESS FOR IC DEVICE FABRICATION

BACKGROUND OF THE INVENTION (1) Field of the Invention

The invention relates to the fabrication of integrated circuit devices, and more particularly, to a method of forming buried contacts having low contact resistance in conjunction with butted contact formation in the fabrication of integrated circuits.

(2) Description of the Prior Art

Referring to FIG. 1, a typical buried contact is formed by depositing a doped layer of polysilicon 16 over and on the planned buried contact region in a semiconductor substrate 10. The buried contact region 20 is doped by outdiffusion of dopants from the doped polysilicon layer 16 into the silicon substrate or by ion implantation into the layer 16. The doped polysilicon layer is allowed to remain on the buried contact region as its contact. The polysilicon 16 is then patterned as shown by photoresist mask 25. During etching of the polysilicon 16, a portion of the semiconductor substrate within the buried contact area will be exposed. The substrate is deliberately exposed to provide a larger contact area for the planned butted contact by making use of the trench sidewall area.

During polysilicon overetching, a buried contact trench 27 will be etched. The trench depth is (A–B)+overetch (to remove polysilicon residue). The trench 27 could be etched deeper than the junction 20. However, the doped polysilicon 38, shown in FIG. 3 will dope the area surrounding the sidewalls of the trench. An oxide layer 30 is deposited over the polysilicon layer 16 and within the contact opening and within the trench 27, as shown in FIG. 2. A second photoresist mask 35 is formed over the substrate with an opening for a planned butted contact.

The oxide layer 30 is etched away where it is not covered by the mask 35. Oxide residue 31 remains within the trench, as shown in FIG. 3. A polysilicon layer 38 forms the butted contact to polysilicon 16 and the substrate active region within the opening. The residual oxide within the trench will cause high contact resistance which is not desirable. Because of the oxide residue, there is less contact area for the junction. The trench sidewall contact area between the polysilicon and the substrate contribute significantly to conductivity. Also, the oxide residue will prevent dopant outdiffusion into the silicon substrate surrounding the sidewalls of the trench. This also will cause high contact resistance.

Overetching of as much as between about 8000 and 12,000 Angstroms is required to remove the oxide residue from the trench to guarantee a good butted contact. It is sometimes necessary to overetch by 400 to 500%. This is expensive. The longer etch time required for overetching means longer equipment processing time and therefore, higher wafer processing costs. It is desired to find a method of forming a trenched butted contact without excessive overetching.

U.S. Pat. Nos. 5,340,774 to Yen and 5,780,331 to Liaw et al teach buried contact processes. U.S. Pat. No. 5,721,146 to Liaw et al teaches forming a buried contact in a trench. U.S. Pat. No. 5,716,881 to Liang et al discloses an SRAM buried contact process. U.S. Pat. No. 5,827,764 shows a butt contact in a buried contact process.

SUMMARY OF THE INVENTION

A principal object of the present invention is to provide an effective and very manufacturable method of forming buried contact junctions.

Another object of the present invention is to provide a method of forming a butted contact and buried contact junctions.

Yet another object is to provide a method for forming a butted contact and a buried contact having low contact resistance in the fabrication of integrated circuits.

A further object of the invention is to provide a method of forming a buried contact which minimizes trenching into the silicon substrate.

A still further object of the invention is to provide a method of forming a buried contact and forming a butted contact with low contact resistance which minimizes trenching into the silicon substrate.

In accordance with the objects of this invention a new method of forming a butted contact and a buried contact having low contact resistance in the fabrication of integrated circuits is achieved. A layer of gate silicon oxide is provided over the surface of a semiconductor substrate. A first layer of polysilicon is deposited overlying the gate silicon oxide layer. The first polysilicon and gate oxide layers are etched away where they are not covered by a mask to provide an opening to the semiconductor substrate where a planned buried contact junction will be formed. A second polysilicon layer is deposited overlying the first polysilicon layer and the planned buried contact junction and doped whereby the planned buried contact junction is formed in the semiconductor substrate underlying the doped second polysilicon layer. The second polysilicon layer is planarized. The first and second polysilicon layers are etched away where they are not covered by a mask to provide an opening overlying a portion of the buried contact junction wherein a trench is etched into the semiconductor substrate where the semiconductor substrate is not covered by the gate oxide layer. An oxide layer is deposited overlying the second polysilicon layer, the gate oxide layer exposed within the opening and within the trench. The oxide layer is etched away where it is not covered by a mask wherein the trench and a portion of the second polysilicon layer overlying the buried contact junction and adjacent to the trench are exposed and whereby the oxide is removed from the trench. A third polysilicon layer is deposited overlying the oxide layer and the second polysilicon layer and the trench exposed within the opening. The third polysilicon layer is patterned to form a butted contact with the second polysilicon layer exposed within the opening completing fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
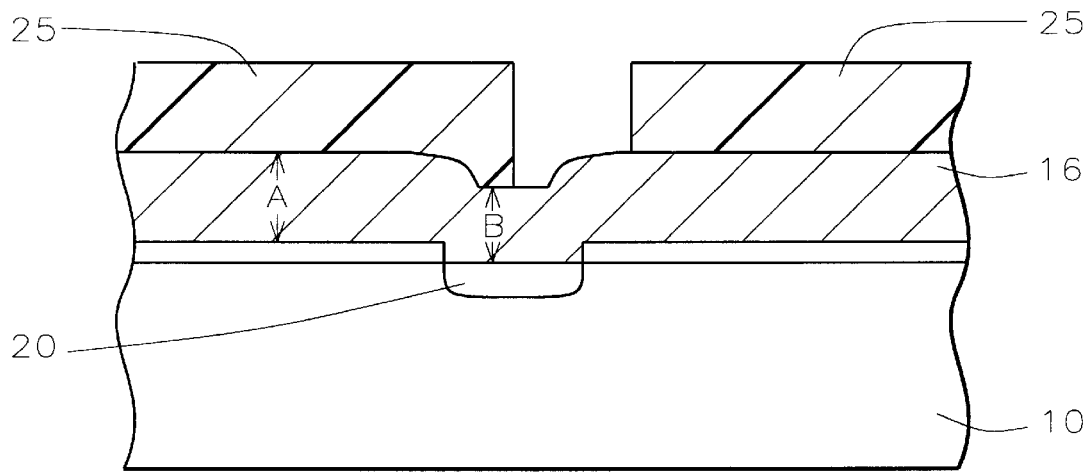
FIGS. 1 through 3 schematically illustrate in cross-sectional representation an embodiment of the prior art.
Figure 2:
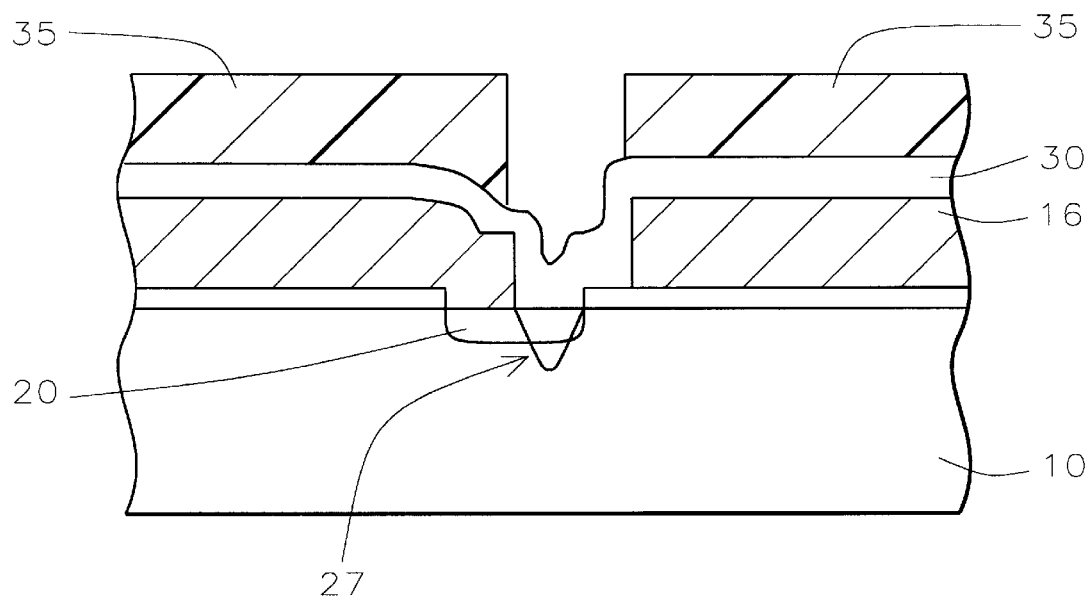
Figure 3:
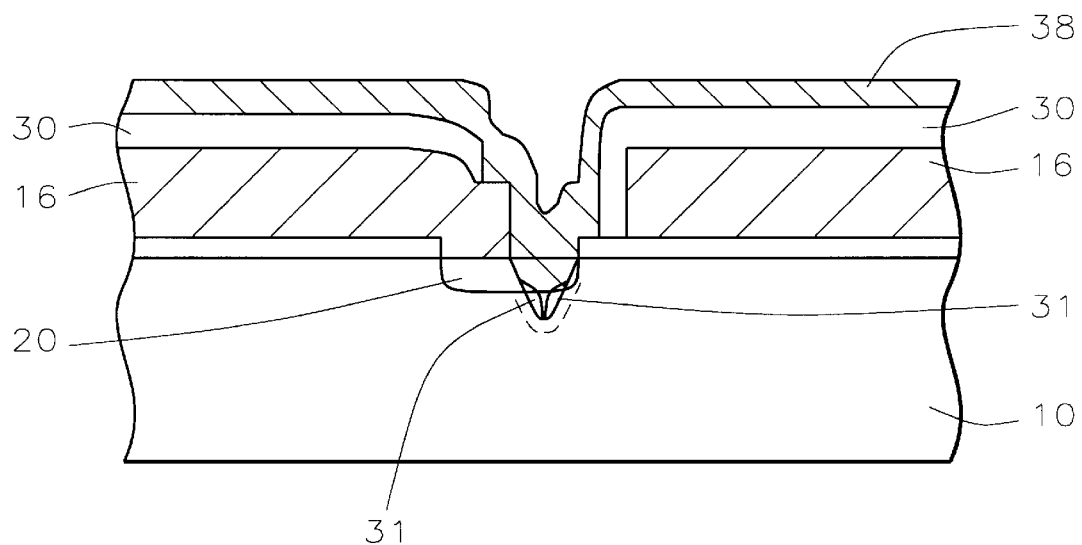
Figure 4:
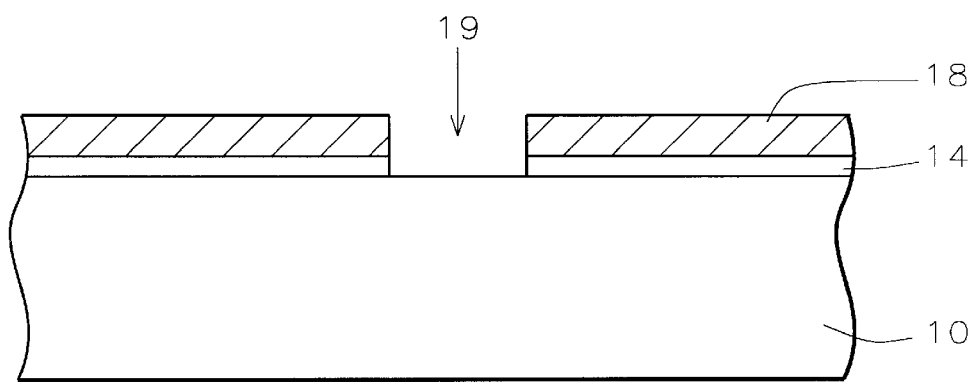
FIGS. 4 through 12 schematically illustrate in cross-sectional representation a preferred embodiment of the present invention.

The process of the invention can be used in any application in which a good butted contact with low contact resistance is required. For example, FIGS. 4–13 illustrate a four transistor static random access memory (SRAM)

device. Referring now more particularly to FIG. 4, there is shown a portion of a partially completed integrated circuit. There is shown a monocrystalline semiconductor substrate 10. A gate oxide layer 14 is grown on the surface of the semiconductor substrate, typically to a thickness of between about 30 to 60 Angstroms. Preferably, a split poly process is used and will be described here. A polysilicon layer 18 is deposited over the gate oxide layer to a thickness of between about 500 to 1000 Angstroms.

A buried contact mask is used to form the photoresist mask (not shown) over the surface of the substrate. The gate oxide layer 14 and the polysilicon layer 18 are etched away where they are not covered by the mask to form the buried contact opening 19. The photoresist mask is removed.

Figure 5:
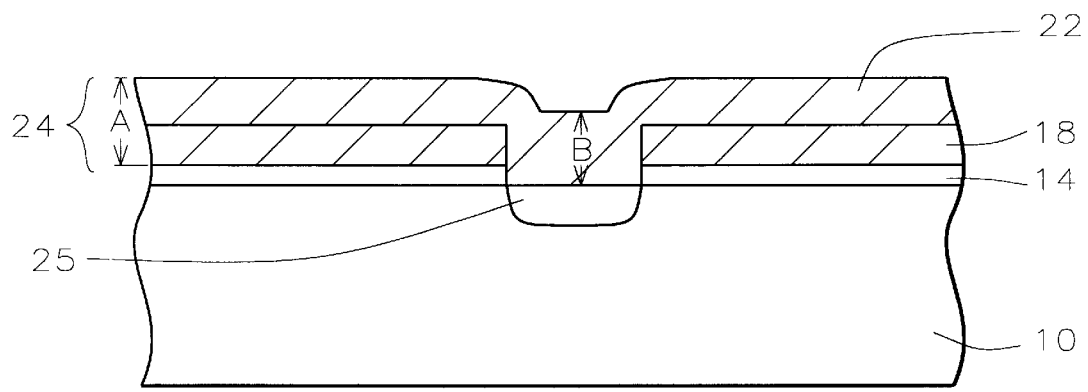

Referring now to FIG. 5, the second polysilicon layer 22 is blanket deposited by low pressure chemical vapor deposition (LPCVD) to a thickness of between about 800 to 1500 Angstroms. The polysilicon layer 22 is doped by phosphorus implant or in-situ doping during deposition. In the case of in-situ doping, the buried contact region 25 is formed by outdiffusion of the dopant form the polysilicon 22 when the polysilicon comes in contact with the substrate during deposition. In the case of doping by ion implantation, the buried contact 25 is formed after a dopant activation step.

The combined layers 18 and 22 form the split polysilicon layer. Henceforth, the layers will be combined in the drawings and labeled 24. The thickness of the combined polysilicon layer 24 over the gate oxide layer 14 is A, shown in FIG. 5. The thickness of layer 24 within the buried contact opening is B. It is this difference in thickness that causes the prior art trench to be so deep—between about 1000 and 2000 Angstroms into the substrate.

Figure 6:
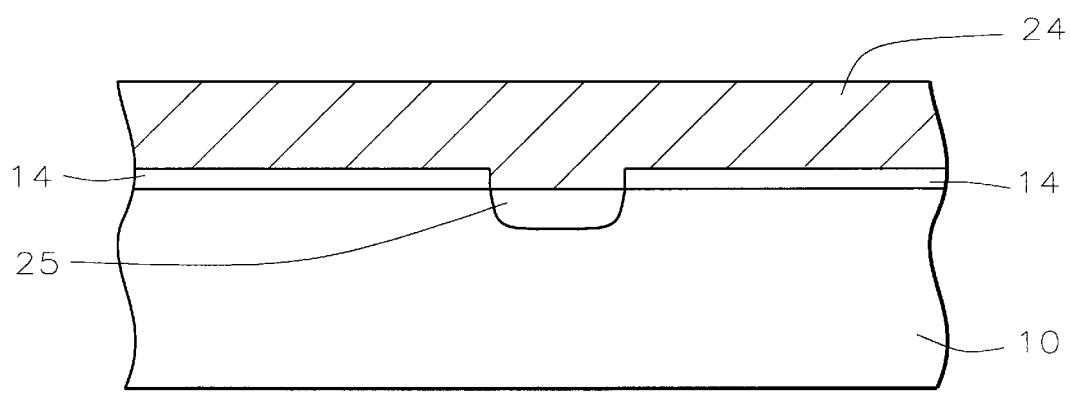

The present invention planarizes the split polysilicon layer 24 using, for example, chemical mechanical polishing (CMP) at this point, as shown in FIG. 6. The planarized split poly layer 24 has a thickness of between about 1000 and 2500 Angstroms.

Figure 7:
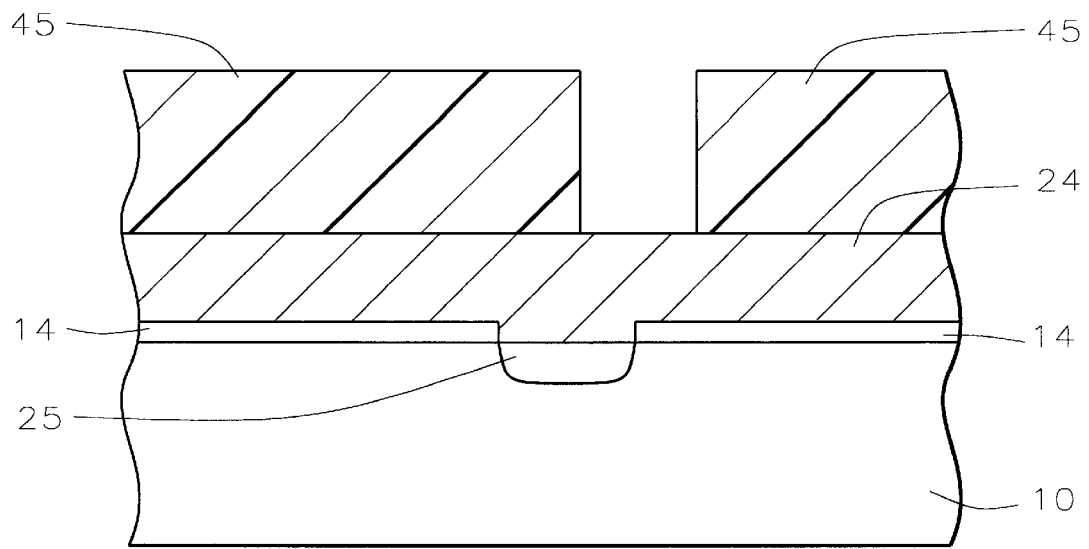
Figure 8:
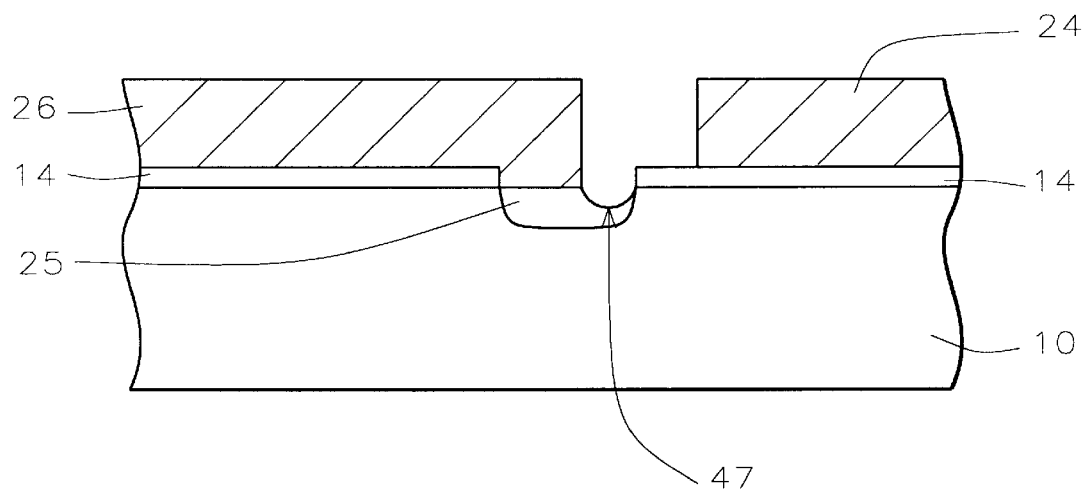

Referring now to FIG. 7, a layer of photoresist is coated over the polysilicon layer 24 and patterned to form the buried contact photoresist mask 45. As illustrated in FIG. 8, the polysilicon layer 24 is etched away where it is not covered by the photomask 45. During patterning of the layer 24, a trench 47 is etched into the semiconductor substrate where it is not covered by the gate oxide layer 14. This trench formation is deliberate so as to make use of the trench sidewall as the butted contact area.

In the prior art, the trench depth is (A–B)+overetch, which is between about 1000 and 2000 Angstroms. Since the split polysilicon layer is planarized in the process of the invention, the trench depth is the overetch thickness only, which will be much less than 1000 Angstroms. The process of the invention minimizes trenching of the substrate. Overetching is required to prevent shorting between polysilicon lines.

Figure 9:
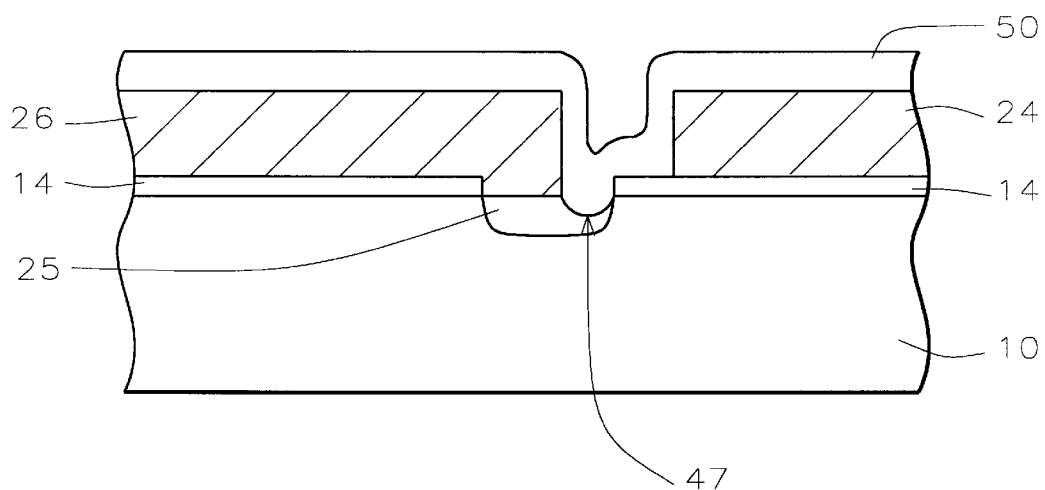

Now, referring to FIG. 9, an interpoly dielectric layer 50 is deposited over the surface of the substrate, covering the split polysilicon layer 24 and the exposed semiconductor substrate within the trench 47 and the exposed gate oxide layer 14 within the opening. The interpoly dielectric layer is preferably silicon oxide layer deposited by low pressure chemical vapor deposition (LPCVD) using a tetraethoxysilane (TEOS) source to a thickness of between about 1000 and 2000 Angstroms.

Figure 10:
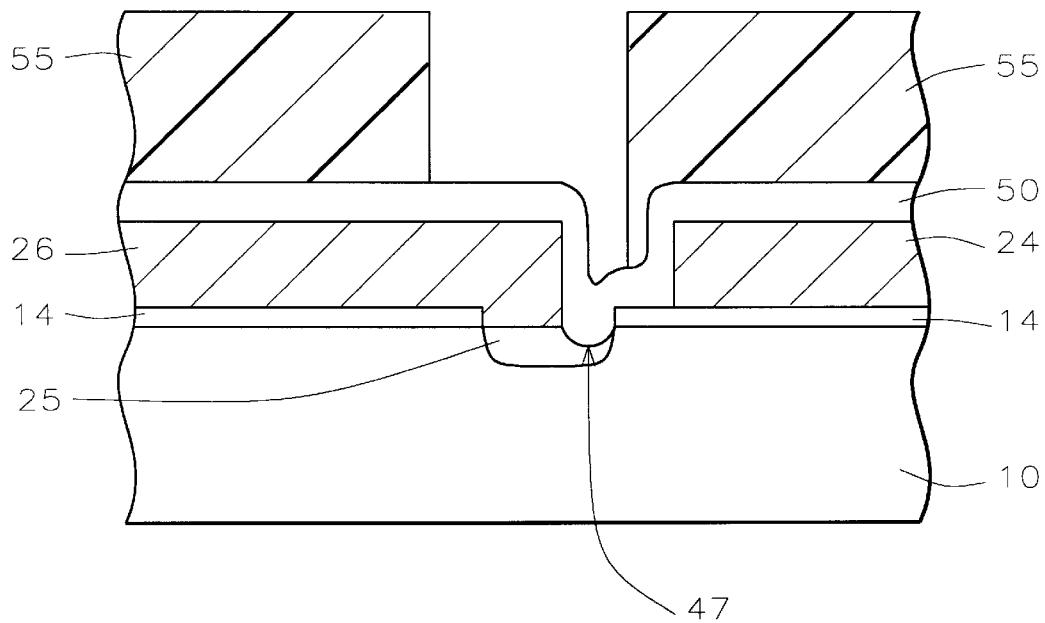
Figure 11:
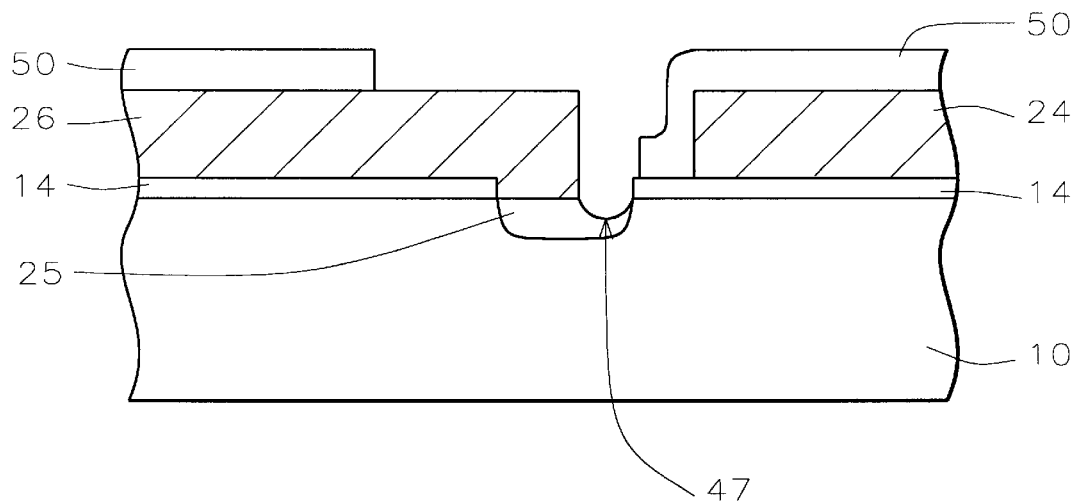

Referring to FIG. 10, a photomask 55 is formed over the oxide layer 50 with an opening for a butted contact. The oxide layer is etched away where it is not covered by the mask 55. Since the trench 47 is much shallower than the trench of the prior art, the oxide residue within the trench can be removed with much less overetching, as shown in FIG. 11. Overetching required will be about 100 to 200% rather than the 400 to 500% overetching required in the prior art.

Figure 12:
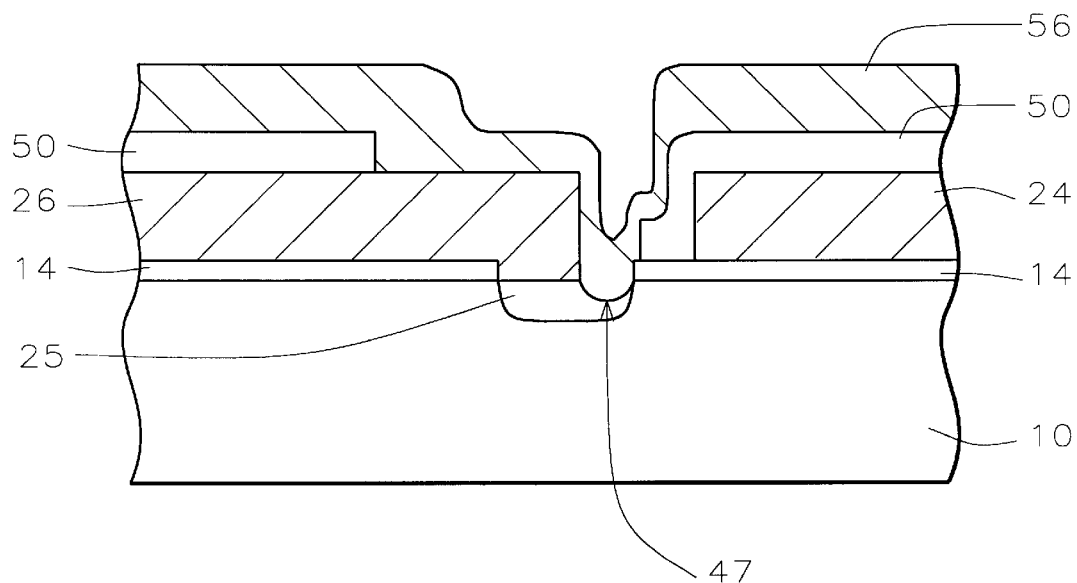
Figure 13:
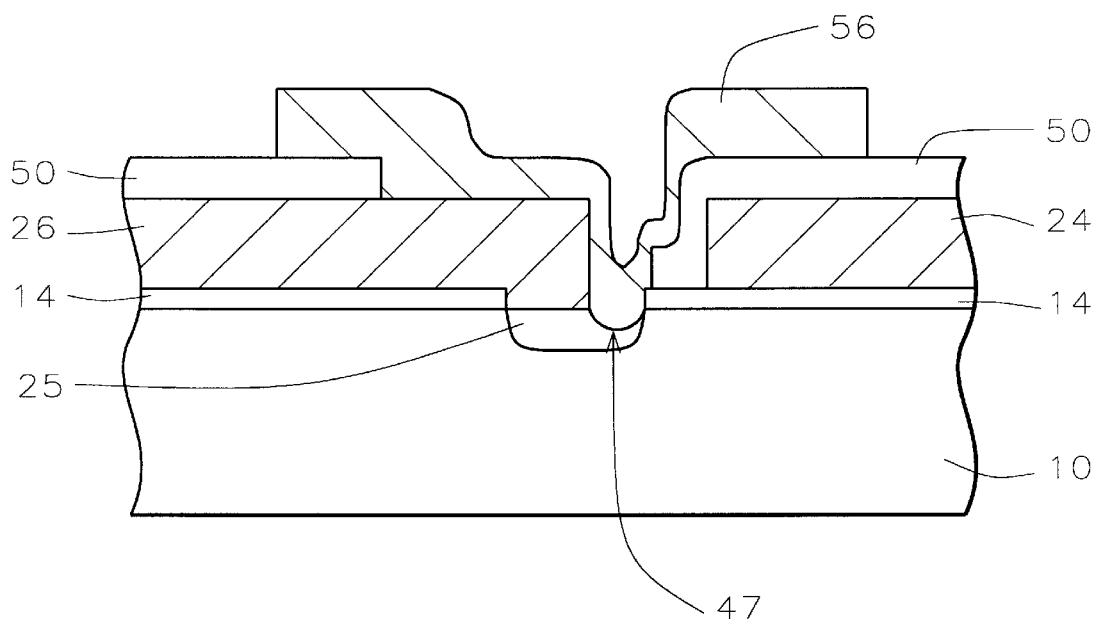
FIG. 13 schematically illustrates in cross-sectional representation a static random access memory (SRAM) device fabricated according to the process of the present invention.

A third polysilicon layer 56 is deposited over the surface of the substrate and within the opening to a thickness of between about 500 and 1500 Angstroms, as illustrated in FIG. 12. The third polysilicon layer is patterned as shown in FIG. 13. The polysilicon 56 to polysilicon 26 forms a butted contact overlying the buried contact 25.

The static random access memory (SRAM) device of the present invention having a conduction channel between a butted contact and an adjoining buried contact is illustrated in FIG. 13. The integrated circuit device comprises a gate electrode 24 on the surface of a semiconductor substrate 10, a butted contact between polysilicon layer 26 and polysilicon layer 56, and a buried contact junction 25 underlying the polysilicon contact 26. A conduction channel is provided from the polysilicon layer 56, through the polysilicon contact 26 and the sidewall of the trench 47, to the buried contact junction 25.

The process of the invention can be used in making any device including a buried contact process. The process of the invention provides a good conduction channel between the buried contact and the butted contact. The key feature of planarizing the split polysilicon layer before patterning makes it possible to minimize trenching which reduces oxide residue in the active region and thereby achieve better control of contact resistance.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of gate silicon oxide over the surface of a semiconductor substrate;

depositing a first layer of polysilicon overlying said gate silicon oxide layer;

etching away said first polysilicon and said gate oxide layer where they are not covered by a mask to provide an opening to said semiconductor substrate where a planned buried contact junction will be formed;

depositing a second polysilicon layer overlying said first polysilicon layer and said planned buried contact junction and doping said second polysilicon layer whereby said planned buried contact junction is formed in said semiconductor substrate underlying said doped second polysilicon layer;

planarizing said second polysilicon layer;

etching away said first and second polysilicon layers where they are not covered by a mask to provide an opening overlying a portion of said buried contact junction wherein a trench is etched into said semiconductor substrate where said semiconductor substrate is not covered by said gate oxide layer;

depositing an oxide layer overlying said second polysilicon layer, said gate oxide layer exposed within said opening and within said trench;

etching away said oxide layer where it is not covered by a mask wherein said trench and a portion of said second polysilicon layer overlying said buried contact junction and adjacent to said trench are exposed and whereby said oxide is removed from said trench;

depositing a third polysilicon layer overlying said oxide layer and said second polysilicon layer and said trench exposed within said opening; and patterning said third polysilicon layer whereby said third polysilicon layer forms a butted contact with said second polysilicon layer exposed within said opening completing said fabrication of said integrated circuit device.

2. The method according to claim 1 wherein said first polysilicon layer has a thickness of between about 500 and 1000 Angstroms.

3. The method according to claim 1 wherein said second polysilicon layer has a thickness of between about 800 and 1500 Angstroms.

4. The method according to claim 1 wherein said first and second polysilicon layers are doped by in-situ doping.

5. The method according to claim 1 wherein said first and second polysilicon layers are doped by ion implantation.

6. The method according to claim 1 wherein said step of planarizing said second polysilicon layer is performed by chemical mechanical polishing.

7. The method according to claim 1 wherein said after said step of planarizing said second polysilicon layer the combined thickness of said first and second polysilicon layers is between about 1000 and 2500 Angstroms.

8. The method according to claim 1 wherein said trench has a depth of less than 1000 Angstroms.

9. The method according to claim 1 wherein said oxide layer has a thickness of between about 1000 and 2000 Angstroms.

10. The method according to claim 1 wherein said third polysilicon layer has a thickness of between about 500 and 1500 Angstroms.

11. The method according to claim 1 wherein said integrated circuit device is a four transistor SRAM device.

12. A method of fabricating an integrated circuit device having a conduction channel between a third polysilicon layer through a butted contact to an adjoining buried contact junction comprising:

providing a layer of gate silicon oxide over the surface of a semiconductor substrate;

depositing a first layer of polysilicon overlying said gate silicon oxide layer;

etching away said first polysilicon and said gate oxide layer where they are not covered by a mask to provide an opening to said semiconductor substrate where a planned said buried contact junction will be formed;

depositing a second polysilicon layer overlying said first polysilicon layer and said planned buried contact junction and doping said second polysilicon layer whereby said planned buried contact junction is formed in said semiconductor substrate underlying said doped second polysilicon layer;

planarizing said second polysilicon layer by chemical mechanical polishing;

etching away said first and second polysilicon layers where they are not covered by a mask to provide an opening overlying a portion of said buried contact junction wherein a trench is etched into said semiconductor substrate where said semiconductor substrate is not covered by said gate oxide layer;

depositing an oxide layer overlying said second polysilicon layer, said gate oxide layer exposed within said opening and within said trench;

etching away said oxide layer where it is not covered by a mask wherein said trench and a portion of said second polysilicon layer overlying said buried contact junction and adjacent to said trench are exposed and whereby said oxide is removed from said trench;

depositing said third polysilicon layer overlying said oxide layer and said second polysilicon layer and said trench exposed within said opening; and patterning said third polysilicon layer whereby said third polysilicon layer forms said butted contact with said second polysilicon layer exposed within said opening completing said fabrication of said integrated circuit device having a conduction channel between said third polysilicon layer through said butted contact to adjoining said buried contact junction.

13. The method according to claim 12 wherein said first polysilicon layer has a thickness of between about 500 and 1000 Angstroms.

14. The method according to claim 12 wherein said second polysilicon layer has a thickness of between about 800and 1500 Angstroms.

15. The method according to claim 12 wherein said polysilicon layers are doped by in-situ doping.

16. The method according to claim 12 wherein said polysilicon layers are doped by ion implantation.

17. The method according to claim 12 wherein said after said step of planarizing said second polysilicon layer the combined thickness of said first and second polysilicon layers is between about 1000 and 2500 Angstroms.

18. The method according to claim 12 wherein said trench has a depth of less than 1000 Angstroms.

19. The method according to claim 12 wherein said oxide layer has a thickness of between about 1000 and 2000Angstroms.

20. The method according to claim 12 wherein said third polysilicon layer has a thickness of between about 500and 1500 Angstroms.

21. The method according to claim 12 wherein said integrated circuit device is a four transistor SRAM device.

* * * * *